United States Patent
Graf et al.

(10) Patent No.: US 9,484,239 B2
(45) Date of Patent: Nov. 1, 2016

(54) SACRIFICIAL CARRIER DICING OF SEMICONDUCTOR WAFERS

(71) Applicant: International Business Machines Corporation, Armonk, NY (US)

(72) Inventors: Richard S. Graf, Gray, ME (US); Douglas O. Powell, Endicott, NY (US); David J. Russell, Owego, NY (US); David J. West, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/858,014

(22) Filed: Sep. 18, 2015

(65) Prior Publication Data

US 2016/0079111 A1    Mar. 17, 2016

Related U.S. Application Data

(63) Continuation of application No. 14/488,496, filed on Sep. 17, 2014.

(51) Int. Cl.
| | |
|---|---|
| *H01L 21/78* | (2006.01) |
| *H01L 21/683* | (2006.01) |
| *H01L 21/268* | (2006.01) |
| *H01L 21/304* | (2006.01) |
| *H01L 21/67* | (2006.01) |
| *H01L 23/544* | (2006.01) |

(52) U.S. Cl.
CPC ....... *H01L 21/6835* (2013.01); *H01L 21/2686* (2013.01); *H01L 21/304* (2013.01); *H01L 21/67092* (2013.01); *H01L 21/67115* (2013.01); *H01L 21/6836* (2013.01); *H01L 21/78* (2013.01); *H01L 23/544* (2013.01); *H01L 2221/68318* (2013.01); *H01L 2221/68327* (2013.01); *H01L 2221/68381* (2013.01); *H01L 2223/54453* (2013.01)

(58) Field of Classification Search
CPC ............... H01L 21/78; H01L 21/6836; H01L 21/6835; H01L 21/304; H01L 2221/68327; H01L 21/2686; H01L 21/67092; H01L 21/67115

See application file for complete search history.

(56) References Cited

U.S. PATENT DOCUMENTS

| | | | |
|---|---|---|---|
| 6,506,664 B1 * | 1/2003 | Beyne ................ | H01L 21/6835 257/E21.705 |
| 6,759,121 B2 * | 7/2004 | Alahapperuma ...... | C09J 7/0217 428/343 |
| 6,777,267 B2 | 8/2004 | Ruby et al. | |

(Continued)

FOREIGN PATENT DOCUMENTS

JP        2007-152440      *    6/2007

OTHER PUBLICATIONS

List of IBM Patents or Patent Applications Treated as Related (Appendix P) dated Sep. 18, 2015, 2 pages.

*Primary Examiner* — Michael Trinh
(74) *Attorney, Agent, or Firm* — Francis Lammes; Stephen J. Walder, Jr.; Damion Josephs

(57) ABSTRACT

Mechanisms are provided for sacrificial carrier dicing of semiconductor wafers. A bottom layer of a semiconductor wafer is bonded to a top layer of a sacrificial carrier. The semiconductor wafer is diced into a set of chips, such that the dicing cuts through the semiconductor wafer and into the sacrificial carrier and such that the sacrificial carrier dresses a diamond blade of a saw so as to expose one or more new, sharp layers of diamonds on the diamond blade.

9 Claims, 6 Drawing Sheets

(56) References Cited

U.S. PATENT DOCUMENTS

| | | | |
|---|---|---|---|
| 6,936,525 B2 * | 8/2005 | Nishiyama | H01L 21/561 257/E21.503 |
| 7,112,467 B2 | 9/2006 | Eichelberger et al. | |
| 7,169,248 B1 | 1/2007 | Kirby et al. | |
| 7,297,610 B2 | 11/2007 | Yang | |
| 7,501,300 B2 | 3/2009 | Abe | |
| 7,863,104 B2 | 1/2011 | Kroeninger et al. | |
| 8,143,112 B1 * | 3/2012 | Doan | H01L 33/0079 257/E21.17 |
| 8,535,983 B2 * | 9/2013 | Hin | H01L 21/568 257/E21.502 |
| 2005/0194670 A1 | 9/2005 | Kameyama et al. | |
| 2010/0144120 A1 | 6/2010 | Segawa et al. | |
| 2011/0008949 A1 * | 1/2011 | Sugimura | C09J 7/0296 438/464 |
| 2013/0122689 A1 | 5/2013 | Wang et al. | |

* cited by examiner

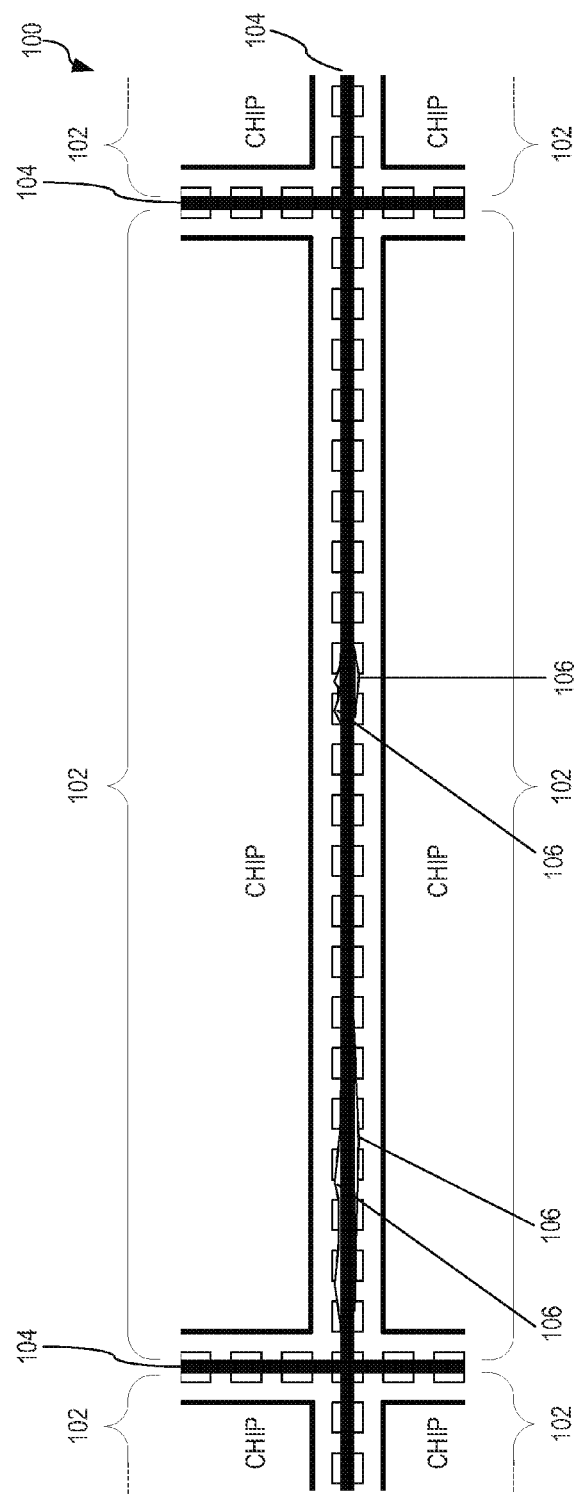
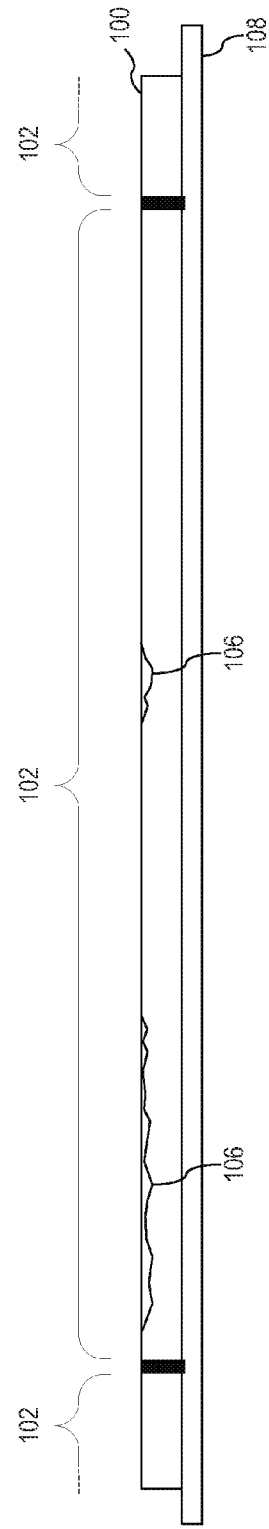
FIG. 1A
FIG. 1B

SACRIFICIAL CARRIER DICING OF SEMICONDUCTOR WAFERS

BACKGROUND

The present application relates generally to an improved apparatus and method and more specifically to mechanisms for sacrificial carrier dicing of semiconductor wafers.

In electronics, a wafer, which may also be referred to as a slice or substrate, is a thin slice of semiconductor material, such as a silicon crystal, used in the fabrication of integrated circuits and other microelectronic devices. The wafer serves as the substrate for microelectronic devices built in and over the wafer and undergoes many micro-fabrication processing steps such as doping or ion implantation, etching, deposition of various materials, and photolithographic patterning. Finally, the individual microelectronic devices or chips are separated through a process referred to as wafer dicing. A chip in the context of integrated circuits is a small block of semiconducting material, on which a given microelectronic device or functional circuit is fabricated.

Wafer dicing is the process by which chips are separated from a wafer of semiconductor following the processing of the wafer. The dicing process may be accomplished by scribing and breaking, by mechanical sawing (normally with a machine called a dicing saw), or by laser cutting. All methods of wafer dicing are typically automated to ensure precision and accuracy. Following the dicing process, the individual silicon chips are typically joined to chip carriers and encapsulated, which are then suitable for use in building electronic devices such as computers.

During dicing, wafers are typically mounted on dicing tape which has a sticky backing that holds the wafer on a thin sheet metal frame. Dicing tape has different properties depending on the dicing application. UltraViolet (UV) curable tapes are used for smaller sizes and non-UV dicing tape for larger chip sizes. Once a wafer has been diced, the pieces left on the dicing tape are referred to as chips, dice, or dies. These chips will be packaged in a suitable package or placed directly on a printed circuit board substrate as a "bare chip." The area cut away from a chip is called chip streets, which are typically about 75 micrometers (0.003 inch) wide. Once a wafer has been diced, the chip will stay on the dicing tape until they are extracted by chip handling equipment, such as a chip bonder or chip sorter, later in the electronics assembly process.

The size of the chip left on the tape may range from 35 mm (very large) to 0.1 mm square (very small). The chip created may be any shape generated by straight lines, but they are typically rectangular or square shaped. In some cases, a chip may be in other shapes as well depending on the singulation method used. A full-cut laser dicer has the ability to cut and separate in a variety of shapes.

SUMMARY

In one illustrative embodiment, a method is provided for sacrificial carrier dicing of semiconductor wafers. The illustrative embodiment bonds a bottom layer of a semiconductor wafer to a top layer of a sacrificial carrier. The illustrative embodiment dices the semiconductor wafer into a set of chips. In the illustrative embodiment, the dicing cuts through the semiconductor wafer and into the sacrificial carrier. In the illustrative embodiment, the sacrificial carrier dresses a diamond blade of a saw so as to expose one or more new, sharp layers of diamonds on the diamond blade.

In another illustrative embodiment, a sacrificial carrier dicing structure is provided. The sacrificial carrier dicing structure comprises a bonded structure that further comprises a bottom layer of a semiconductor wafer coupled to a top layer of a sacrificial carrier. The semiconductor wafer is diced into a set of chips by dicing through the semiconductor wafer and into the sacrificial carrier. The sacrificial carrier dresses a diamond blade of a saw so as to expose one or more new, sharp layers of diamonds on the diamond blade.

In yet another illustrative embodiment, an apparatus is provided for sacrificial carrier dicing of semiconductor wafers. The apparatus comprises a saw and a diamond blade mounted in the saw. The diamond blade dices a bonded structure that comprises a bottom layer of a semiconductor wafer coupled to a top layer of a sacrificial carrier. The semiconductor wafer is diced into a set of chips by dicing through the semiconductor wafer and into the sacrificial carrier. The sacrificial carrier dresses the diamond blade of the saw so as to expose one or more new, sharp layers of diamonds on the diamond blade.

These and other features and advantages of the present invention are described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings.

FIG. 1A depicts one top-view example of substandard wafer dicing due to BEOL structures in accordance with an illustrative embodiment.

FIG. 1B depicts one side-view example of the substandard wafer dicing due to BEOL structures illustrated in FIG. 1A in accordance with an illustrative embodiment.

DETAILED DESCRIPTION

Figure 2:
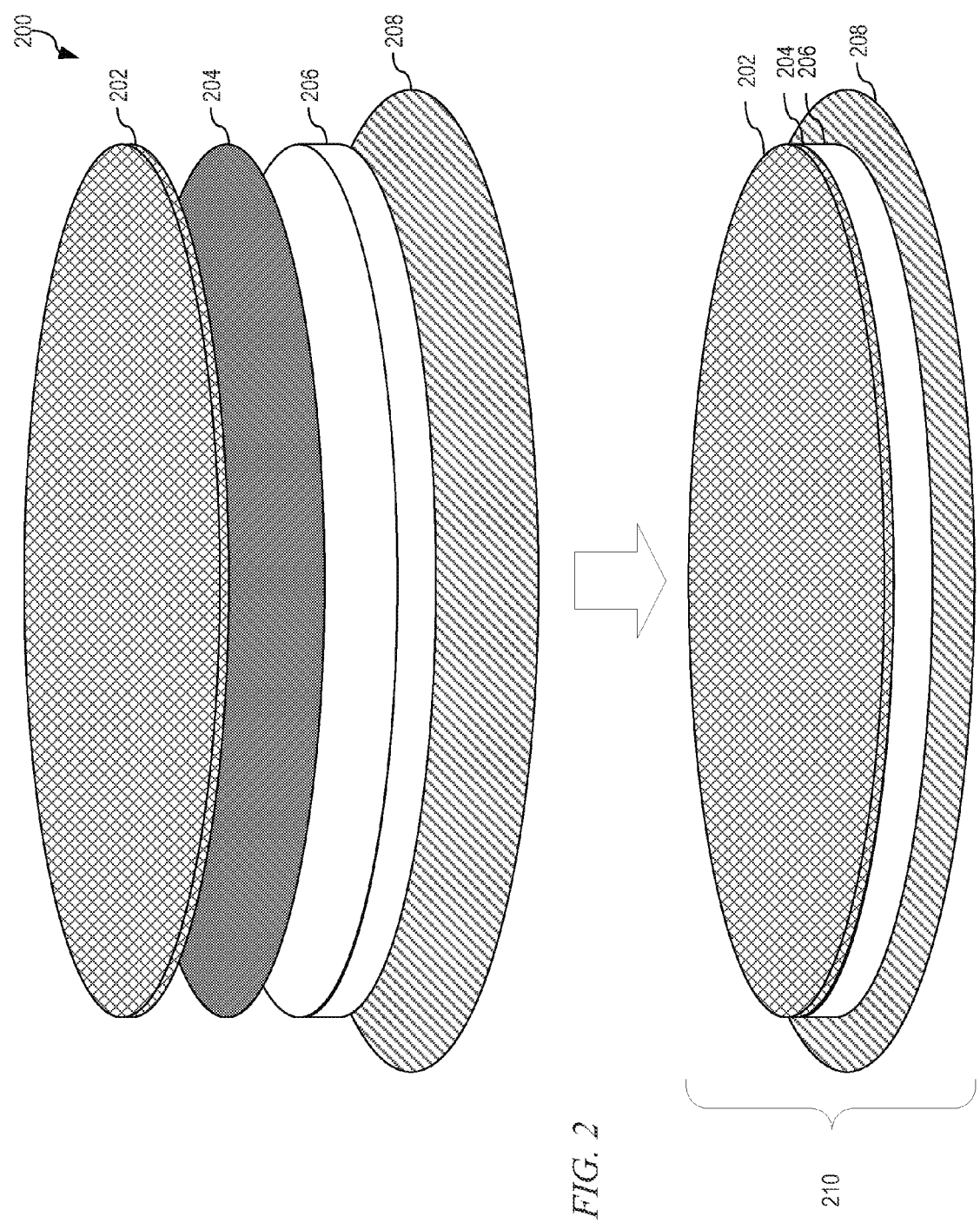
FIG. 2 depicts an exemplary three-dimensional view of a wafer to sacrificial carrier bonding process in accordance with an illustrative embodiment.

In accordance with the illustrative embodiments, a semiconductor wafer, also referred to simply as a wafer, is a thin slice of semiconductor material, such as a silicon crystal, used in the fabrication of integrated circuits and other microelectronic devices. The wafer serves as the substrate for microelectronic devices built in and over the wafer and undergoes many micro-fabrication processing steps such as doping or ion implantation, etching, deposition of various materials, and photolithographic patterning. One of the processing steps is referred to as back end of line (BEOL), which is the second portion of IC fabrication where the individual devices (transistors, capacitors, resistors, etc.) are interconnected with wiring on the wafer. BEOL generally begins when the first layer of metal is deposited on the wafer. BEOL includes contacts, insulating layers (dielectrics), metal levels, and bonding sites for chip-to-package connections.

However, as wafers get thinner and BEOL metal layers get thicker, the separation of the individual microelectronic devices or chips of the wafer, through the process referred to as wafer dicing, becomes more challenging. That is, in the mechanical sawing process used to separate the chips, different materials may be used to "dress" a diamond blade utilized in the mechanical sawing process to expose the diamond particles of the diamond blade for proper cutting. That is, the act of dressing a diamond blade is to wear out the dull layer of diamonds that is exposed on the blade and expose a new, sharp layer of diamonds on the blade, as well as remove any softer material that has collected on the blade from the wafer being cut. An apparatus formed by a saw and a diamond blade includes a saw blade which has diamonds embedded in a matrix within the blade for cutting hard or abrasive materials. However, the metal in the BEOL metal layers reduces the ability of the diamond blade to accurately dice the wafer. FIG. 1A depicts one top-view example of substandard wafer dicing due to BEOL structures in accordance with an illustrative embodiment. In the example, wafer 100 is being cut into a set of chips 102. As the diamond blade dices along lines 104, substandard dicing occurs due to BEOL structures on the active side of wafer 100, resulting in dicing damage of wafer 100 at locations 106. That is, an active side of wafer 100 is a side of wafer 100 where BEOL structures or interconnects, such as solder balls, gold balls, molded studs, and the like, are made to connect one device, wire, or net to one or more other devices, wires, or nets. Although the worse dicing damage typically occurs on the active side of wafer 100 as is shown in FIG. 1B, which would be on the side opposite dicing tape 108, dicing damage may occur throughout the dicing cut. Unacceptable dicing damage may be, for example, anywhere from ~5 microns (for an aggressive thin dicing street) to 100 µm or more if cracks occur. FIG. 1B depicts one side-view example of the substandard wafer dicing due to BEOL structures illustrated in FIG. 1A in accordance with an illustrative embodiment. In the example, wafer 100 is bonded to dicing tape 108 and has been cut into a set of chips 102. As is illustrated, the diamond saw blade dicing of wafer 100 results in substandard dicing due to BEOL structures, which results in dicing damage at locations 106.

In order to reduce the chipping when cutting chips, the illustrative embodiments provide for bonding a thinned wafer upon which integrated circuits and other microelectronic devices are fabricated to a sacrificial carrier for dicing purposes. In one embodiment, a sacrificial glass carrier is used for dressing of the diamond blade. The thinned wafer is bonded to the sacrificial glass carrier using an UltraViolet (UV) sensitive film that will release from each of the chips after separation upon exposure to LTV light. The sacrificial glass carrier utilized is UV transmissible to allow for UV exposure and release from the UV sensitive film. Once exposed to the UV light, each of the chips may be picked from the sacrificial glass carrier. In another embodiment, a sacrificial silicon substrate carrier is used for dressing of the diamond blade. The thinned wafer is bonded to the sacrificial silicon substrate carrier using an Infrared (IR) sensitive film that will release from each of the chips after separation upon exposure to IR light. The sacrificial silicon substrate carrier utilized is IR transmissible to allow for IR exposure and release from the IR sensitive film. In yet another embodiment, a sacrificial carrier with vias is utilized to hold the thinned wafer in place utilizing a vacuum force. Once the chips of the wafer have been cut, the vacuum force is released and the chips are extracted.

The present description and claims may make use of the terms "a," "at least one of," and "one or more of" with regard to particular features and elements of the illustrative embodiments. It should be appreciated that these terms and phrases are intended to state that there is at least one of the particular feature or element present in the particular illustrative embodiment, but that more than one can also be present. That is, these terms/phrases are not intended to limit the description or claims to a single feature/element being present or require that a plurality of such features/elements be present. To the contrary, these terms/phrases only require at least a single feature/element with the possibility of a plurality of such features/elements being within the scope of the description and claims.

In addition, it should be appreciated that the following description uses a plurality of various examples for various elements of the illustrative embodiments to further illustrate example implementations of the illustrative embodiments and to aid in the understanding of the illustrative embodiments. These examples intended to be non-limiting and are not exhaustive of the various possibilities for implementing the illustrative embodiments. It will be apparent to those of ordinary skill in the art in view of the present description that there are many other alternative implementations for these various elements that may be utilized in addition to, or in replacement of, the examples provided herein without departing from the spirit and scope of the present invention.

Again, the illustrative embodiments provide for bonding a thinned wafer upon which integrated circuits and other microelectronic devices are fabricated to a sacrificial carrier for dicing purposes in order to reduce the chipping when cutting chips. FIG. 2 depicts an exemplary three-dimensional view of a wafer to sacrificial carrier bonding process in accordance with an illustrative embodiment. In the illustrated bonding process 200, a bonded structure is created comprising wafer 202, adhesive film 204, sacrificial carrier 206, and clear dicing tape 208. Wafer 202 is an active wafer, thinned to target thickness, and possibly with backside metal applications and back end of line (BEOL) structures. An active wafer is a silicon wafer with active circuitry embedded therein, as opposed to an inactive wafer that functions as an interposer for distributing finer pitch connections of a chip stacked above to larger pitch connections of a substrate below. Backside metal application is applied to a backside of wafer 202 with Through Silicon Vias (TSVs) in order to create a ground surface, or potentially capture pads or additionally routing. BEOL structures are the metal lines and vias and passivation on the active side of the wafer 202. Adhesive film 204 is a film or tape that bonds wafer 202 to sacrificial carrier 206. Adhesive film 204 may be UV sensitive film or IR sensitive film depending on the type of sacrificial carrier 206 that is utilized. UV sensitive film releases the chips of wafer 202 from sacrificial carrier 206 upon exposure to UV light after the chips of wafer 202 have been cut. On the other hand, IR sensitive film releases the chips of wafer 202 from sacrificial carrier 206 upon exposure to IR light after the chips of wafer 202 have been cut.

Sacrificial carrier 206 is a full-thickness carrier and may be composed of a UV transmissible glass or a silicon substrate. A sacrificial UV transmissible glass carrier may be a material such as, for example, as quartz substrate, fused quartz substrate, sapphire glass substrate, or similar material. In another embodiment, the sacrificial UV transmissible glass carrier may be toughened glass, which is toughened through the use of dopants and/or tempering to provide a harder glass substrate which remains UV transmissible. A sacrificial UV transmissible glass carrier is utilized in conjunction with a UV sensitive film. A sacrificial silicon substrate carrier utilizes IR sensitive film that loses tack after exposure to an IR light source. Lastly, clear dicing tape 208 may be either clear non-UV dicing tape or clear non-IR dicing tape depending on the type of sacrificial carrier 206 that is utilized. Clear dicing tape 208 securely bonds sacrificial carrier 206 to a cutting surface of a saw for dicing of wafer 202 into a set of chips. Once all of wafer 202, adhesive film 204, sacrificial carrier 206, and clear dicing tape 208 are bonded together, bonded structure 210 is formed that is ready for dicing of wafer 202 into a set of chips.

Figure 3:
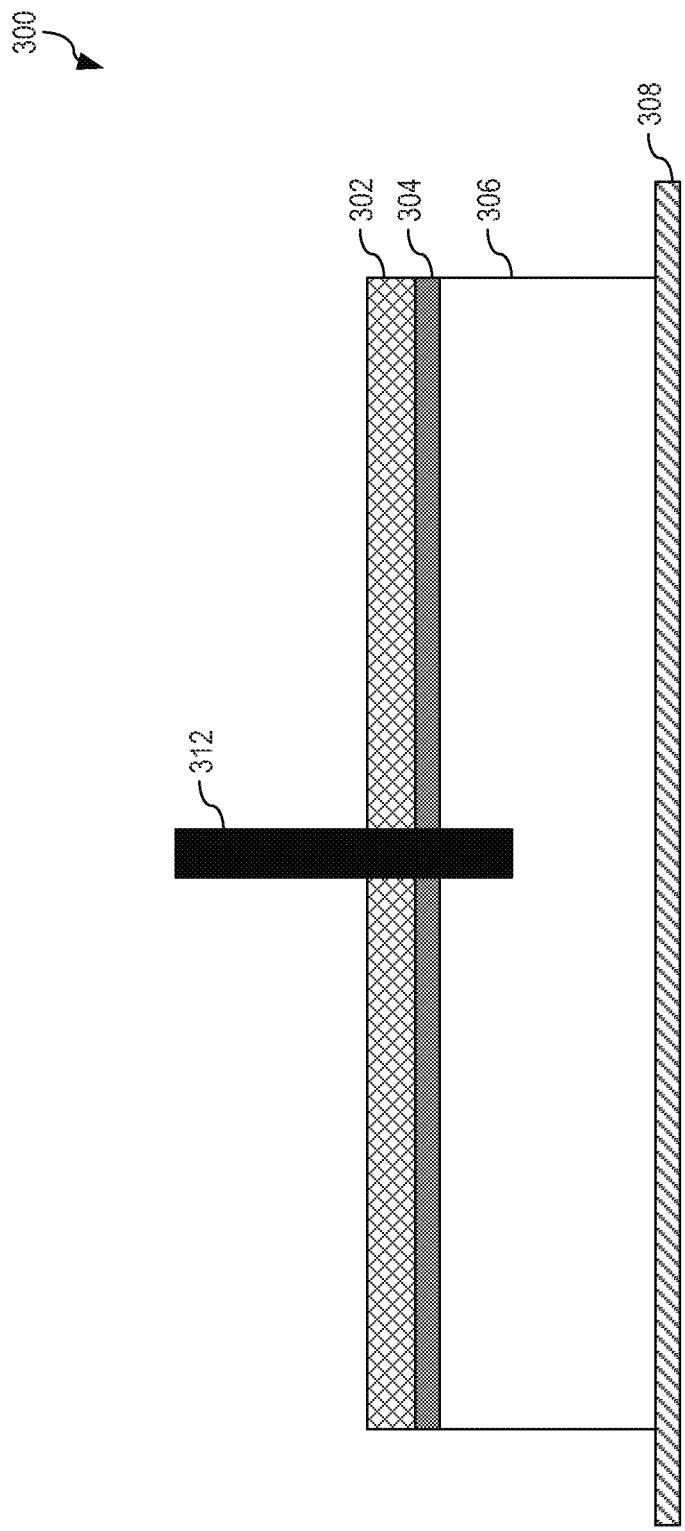
FIG. 3 depicts one exemplary two-dimensional view of a wafer to sacrificial carrier bonding process in accordance with an illustrative embodiment.

FIG. 3 depicts one exemplary two-dimensional view of a wafer to sacrificial carrier bonding process in accordance with an illustrative embodiment. In the illustrated bonding process, bonded structure 300 is created comprising wafer 302, adhesive film 304, sacrificial carrier 306, and clear dicing tape 308. Wafer 302, which is similar to wafer 202 of FIG. 2, is an active wafer, thinned to target thickness, and possibly with backside metal applications and BEOL structures. Adhesive film 304, which is similar to adhesive film 204 of FIG. 2, is a film or tape that bonds wafer 302 to sacrificial carrier 306 that may be UV sensitive film or IR sensitive film depending on the type of sacrificial carrier 306 that is utilized. Sacrificial carrier 306, which is similar to sacrificial carrier 206 of FIG. 2, is a full-thickness carrier and may be composed of a UV transmissible glass or a silicon substrate. Clear dicing tape 308, which is similar to clear dicing tape 208 of FIG. 2, may be either clear non-UV dicing tape or clear non-IR dicing tape depending on the type of sacrificial carrier 306 that is utilized. As is shown in FIG. 3, diamond blade 312 separates the various chips of wafer 302 by cutting through wafer 302 and adhesive film 304 and into sacrificial carrier 306 thereby reducing the chipping to the structure of the chips.

Figure 4:
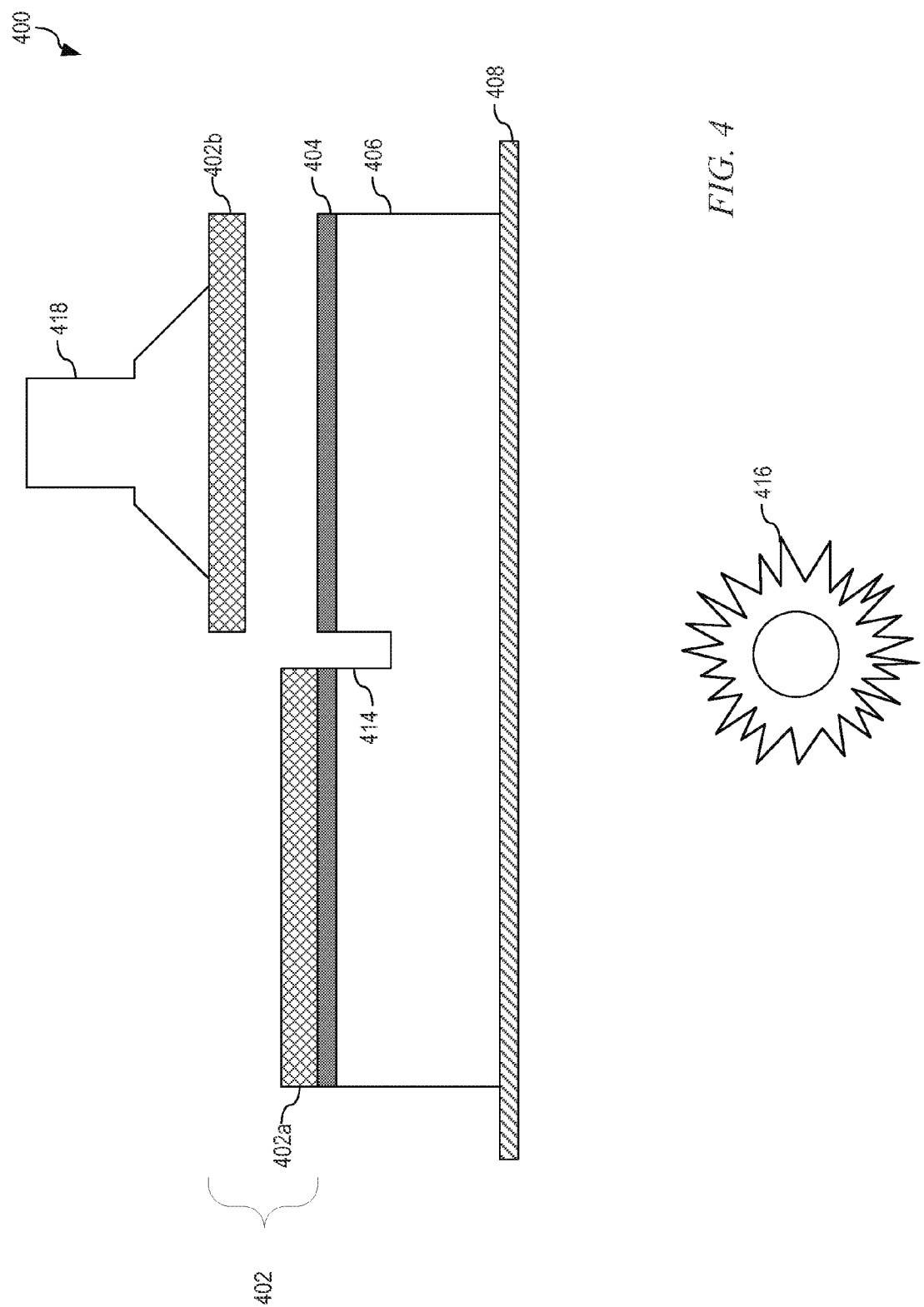
FIG. 4 depicts one exemplary two-dimensional view of extracting a chip from a sacrificial carrier post dicing in accordance with an illustrative embodiment.

FIG. 4 depicts one exemplary two-dimensional view of extracting a chip from a sacrificial carrier post dicing in accordance with an illustrative embodiment. In the illustrated extraction process 400, after the diamond blade has separated wafer 402 into chips 402a and 402b by cutting through the wafer and adhesive film 404 and into sacrificial carrier 406 thereby forming cut 414, energy source 416 produces energy of a specific wavelength, such as a UV light or an IR light, that is transmitted through clear dicing tape 408 and sacrificial carrier 406 thereby releasing the adhesion provided by adhesive film 404 to chips 402a and 402b. By the energy of the specific wavelength causing the adhesion of adhesive film 404 to release, picking mechanism 418 applies a vacuum to the top side of chip 402b and retrieves chips 402b for subsequent encapsulation into a chip carrier or for further processing.

Figure 5:
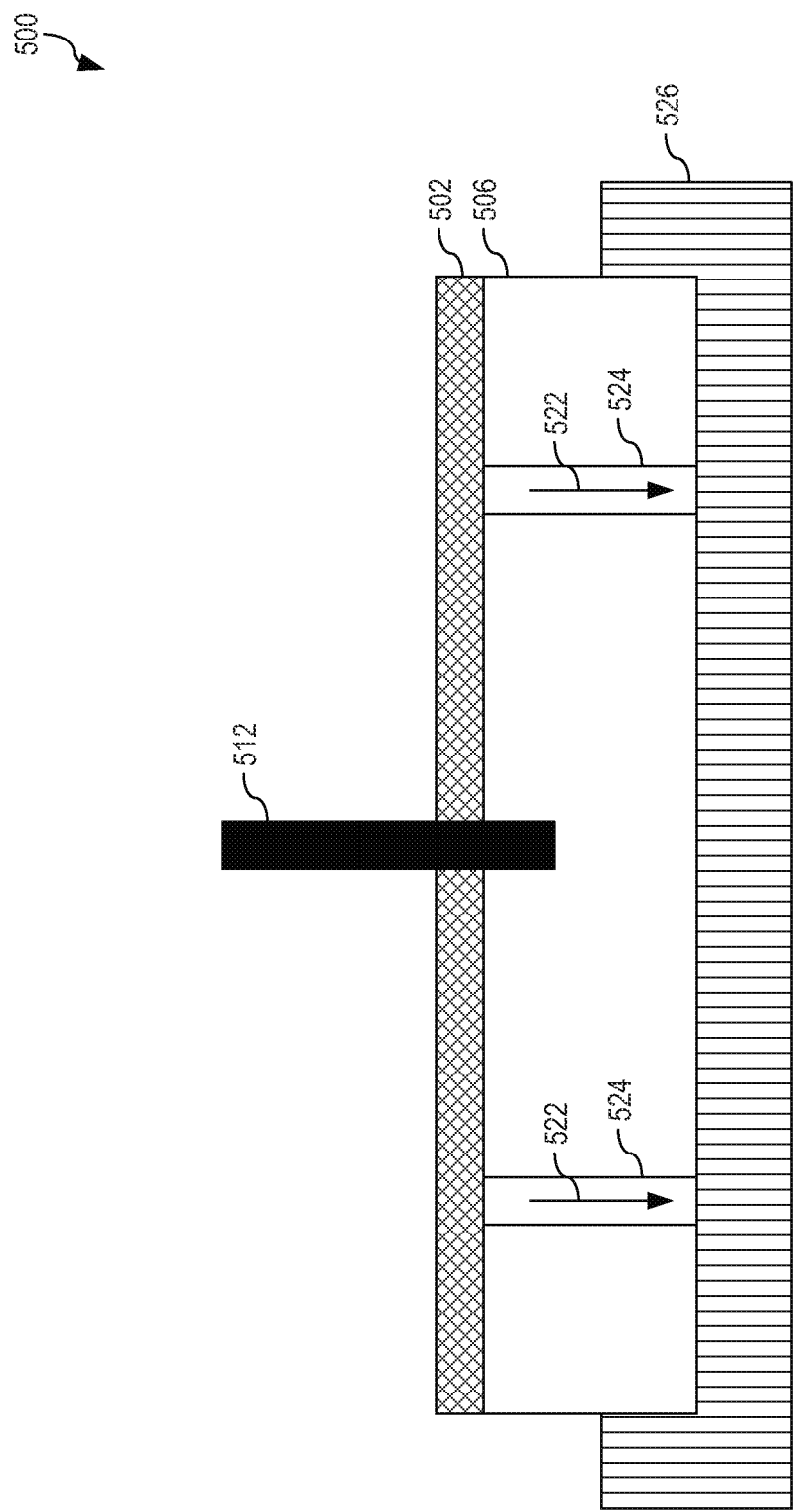
FIG. 5 depicts another exemplary two-dimensional view of a dicing process in accordance with an illustrative embodiment.

FIG. 5 depicts another exemplary two-dimensional view of a dicing process in accordance with an illustrative embodiment. In the illustrated dicing process 500, a bonded structure, such as that illustrated in FIGS. 1-4, is not needed. That is, in dicing process 500, wafer 502 is secured to sacrificial carrier 506 through a vacuum force, indicated by arrows 522, generated by vacuum chuck 526 through vias 524 in sacrificial carrier 506. The vacuum force applied by vacuum chuck 526 during dicing process 500 applies the vacuum force through the carrier 506 and vias 524 to hold the chips of wafer 502 in place as they are diced by diamond blade 512. As is shown in FIG. 5, diamond blade 512 separates the various chips of wafer 502 by cutting through wafer 502 and into sacrificial carrier 506 thereby reducing the chipping to the structure of the chips. In this embodiment, sacrificial carrier 506 may be a thicker sacrificial glass carrier or sacrificial silicon substrate with vias 524 present at the same location as each chip to be diced, where each of vias 524 do not coincide with a cut to be created by diamond blade 512. As with the previous embodiments, wafer 502 is an active wafer, thinned to target thickness, and possibly with backside metal applications and BEOL structures.

Figure 6:
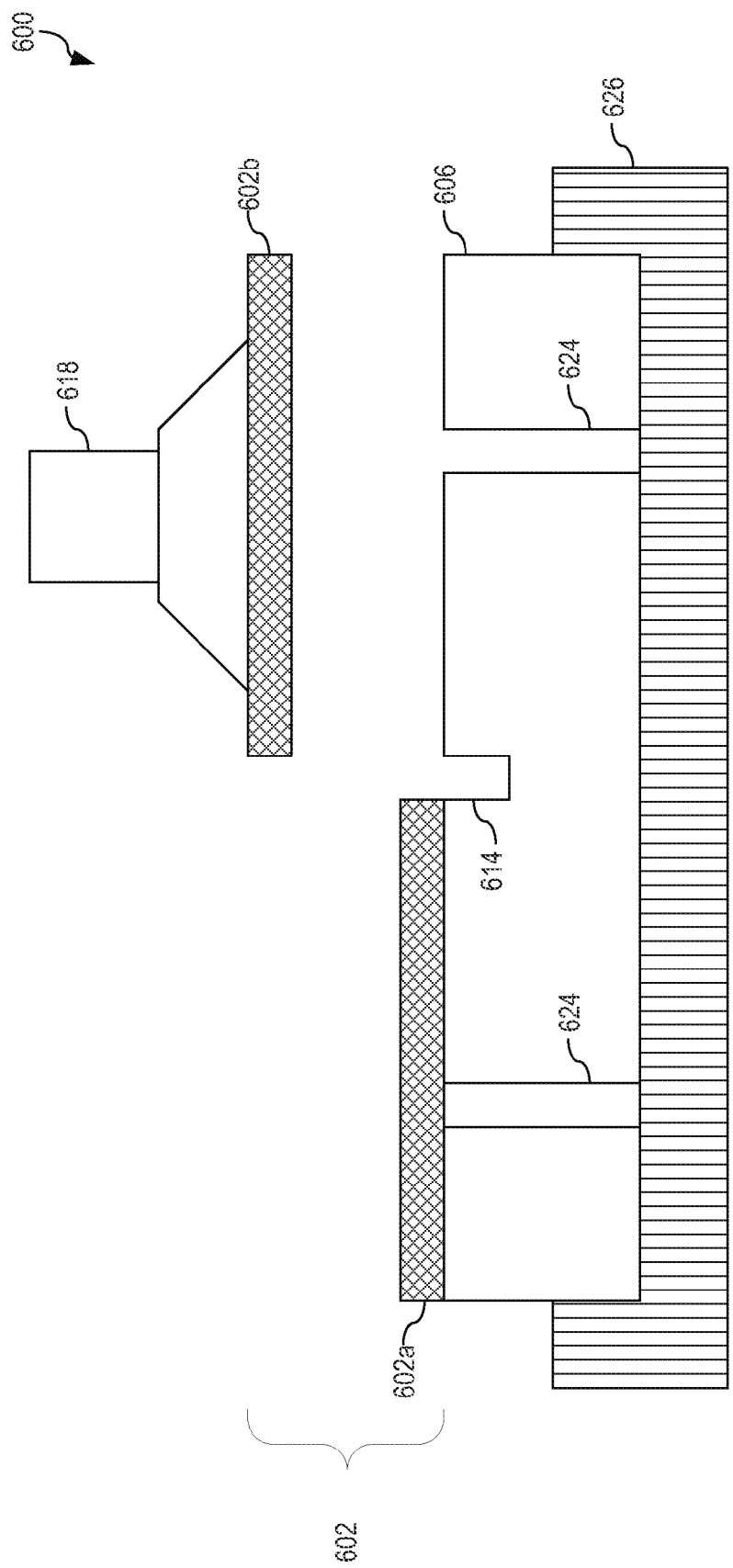
FIG. 6 depicts an exemplary two-dimensional view of extracting a chip from a sacrificial carrier with vias post dicing in accordance with an illustrative embodiment.

FIG. 6 depicts an exemplary two-dimensional view of extracting a chip from a sacrificial carrier with vias post dicing in accordance with an illustrative embodiment. In the illustrated extraction process 600, after the diamond blade has separated wafer 602 into chips 602a and 602b by cutting through wafer 602 and into sacrificial carrier 606, thereby forming cut 614, the vacuum force applied by vacuum chuck 626 through carrier 606 and vias 624 is released, indicated through the absence of arrows indicating the vacuum force in vias 624 as was previously indicated by arrows 522 of FIG. 5. Thus, chips 602a and 602b are resting on carrier 606. Therefore, picking mechanism 618 applies a vacuum to the top side of chip 602b and retrieves chips 602b for subsequent encapsulation into a chip carrier or for further processing.

Thus, the illustrative embodiments provide for bonding a thinned wafer upon which integrated circuits and other microelectronic devices are fabricated to a sacrificial carrier for dicing purposes. In one embodiment, a sacrificial glass carrier is used for dressing of the diamond blade. That is, diamond blades are constructed with what is called a matrix metal that holds the diamonds in place on the blade. As the diamond blade is used to make cuts, this matrix metal flakes away and exposes more diamond to allow for proper, good, and fast cutting. When a diamond blade is used to cut different materials, the matrix metal may experience what is called "glazing over." This is, the heat generated as the blade turns through the material at the point of cutting contact causes the matrix metals to actually melt over the diamonds, rather than flake off and expose more diamonds. Thus, when the matrix metal melts, the matrix metal coats, or "glazes over," the diamonds, and thus, the diamonds stop cutting. Therefore, the act of dressing a diamond blade is to wear out the dull layer of diamonds that is exposed on the blade and expose a new, sharp layer of diamonds on the blade, as well as remove any softer material that has collected on the blade from the wafer being cut as well as any glazed over matrix metal. The thinned wafer is bonded to the sacrificial glass carrier using an UltraViolet (UV) sensitive film that will release from each of the chips after separation upon exposure to UV light. The sacrificial glass carrier utilized is UV transmissible to allow for UV exposure and release from the UV sensitive film. Once exposed to the UV light, each of the chips may be picked from the sacrificial glass carrier. In another embodiment, a sacrificial silicon substrate carrier is used for dressing of the diamond blade. The thinned wafer is bonded to the sacrificial silicon substrate carrier using an Infrared (IR) sensitive film that will release from each of the chips after separation upon exposure to light. The sacrificial silicon substrate carrier utilized is IR transmissible to allow for IR exposure and release from the IR sensitive film. In yet another embodiment, a sacrificial carrier with vias is utilized to hold the thinned wafer in place utilizing a vacuum force. Once the chips of the wafer have been cut, the vacuum force is released and the chips are extracted.

The description of the present invention has been presented for purposes of illustration and description, and is not intended to be exhaustive or limited to the invention in the form disclosed. Many modifications and variations will be apparent to those of ordinary skill in the art without departing from the scope and spirit of the described embodiments. The embodiment was chosen and described in order to best explain the principles of the invention, the practical application, and to enable others of ordinary skill in the art to understand the invention for various embodiments with various modifications as are suited to the particular use contemplated. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for sacrificial carrier dicing of semiconductor wafers, the method comprising:
    bonding a bottom layer of a semiconductor wafer to a top layer of a sacrificial carrier using adhesive film;
    coupling the bottom layer of the semiconductor wafer to the top layer of the sacrificial carrier using a vacuum force, wherein the vacuum force is generated on the bottom layer of the semiconductor wafer through a plurality of vias in the sacrificial carrier;
    bonding the bottom layer of the sacrificial carrier to clear dicing tape, wherein the clear dicing tape securely bonds the sacrificial carrier to a cutting surface of the saw for dicing of the semiconductor wafer into the set of chips; and
    dicing the semiconductor wafer into a set of chips, wherein the dicing cuts through the semiconductor wafer and the adhesive film and into the sacrificial carrier, and wherein the sacrificial carrier dresses a diamond blade of a saw so as to expose one or more new, sharp layers of diamonds on the diamond blade.

2. The method of claim 1, wherein the adhesive film is a UltraViolet (UV) sensitive film, and wherein the set of chips is extracted from the sacrificial carrier after dicing upon exposing the UV sensitive film to a UV light.

3. The method of claim 1, wherein the adhesive film is an Infrared (IR) sensitive film and wherein the set of chips is extracted from the sacrificial carrier after dicing upon exposure of the IR sensitive film to an IR light.

4. The method of claim 1, wherein the sacrificial carrier is a glass sacrificial carrier that is UltraViolet (UV) transmissible.

5. The method of claim 4, wherein the sacrificial glass carrier is comprised of one of the group comprising quartz substrate, fused quartz substrate, and sapphire glass substrate.

6. The method of claim 4, wherein the sacrificial glass carrier is a toughened sacrificial glass carrier and wherein the toughened sacrificial glass carrier is toughened through a use of at least one of dopants or tempering to provide a harder glass substrate which remains UV transmissible.

7. The method of claim 1, wherein the sacrificial carrier is a sacrificial silicon substrate carrier that is Infrared (IR) transmissible.

8. The method of claim 1, wherein the set of chips are extracted from the sacrificial carrier after dicing by releasing the vacuum force upon the set of chips remaining from the semiconductor wafer.

9. The method of claim 1, wherein the bottom layer of the semiconductor wafer is an active side of the semiconductor wafer.

* * * * *